(12) United States Patent
Roohparvar

(10) Patent No.: US 7,274,596 B2
(45) Date of Patent: Sep. 25, 2007

(54) REDUCTION OF ADJACENT FLOATING GATE DATA PATTERN SENSITIVITY

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 143 days.

(21) Appl. No.: 10/881,636

(22) Filed: Jun. 30, 2004

(65) Prior Publication Data

US 2006/0002190 A1    Jan. 5, 2006

(51) Int. Cl.
*G11C 16/04* (2006.01)
(52) U.S. Cl. ............... 365/185.17; 365/185.22; 365/185.19
(58) Field of Classification Search ........... 365/185.17, 365/185.02, 185.18, 185.22, 185.19
See application file for complete search history.

(56) References Cited

U.S. PATENT DOCUMENTS

| 5,543,339 | A | 8/1996 | Roth |
| 6,046,086 | A | 4/2000 | Lin |
| 6,388,919 | B2* | 5/2002 | Terasaki ............... 365/185.33 |
| 6,522,580 | B2* | 2/2003 | Chen et al. ........... 365/185.02 |
| 6,563,165 | B2* | 5/2003 | Sakakibara et al. ....... 257/315 |
| 6,781,877 | B2* | 8/2004 | Cernea et al. ......... 365/185.18 |
| 7,020,026 | B2* | 3/2006 | Guterman et al. ..... 365/185.28 |
| 2005/0117378 | A1* | 6/2005 | Cho et al. .................... 365/63 |
| 2006/0176736 | A1* | 8/2006 | Harari .................. 365/185.17 |

* cited by examiner

*Primary Examiner*—Huan Hoang
(74) *Attorney, Agent, or Firm*—Leffert Jay & Polglaze, P.A.

(57) ABSTRACT

The method for programming non-volatile memory cells erases the memory cells to be programmed. The memory cells are then programmed to a reduced floating gate voltage that takes into account capacitive coupling between the floating gates of adjacent memory cells. In one embodiment, the programming method programs and verifies a first memory cell to the reduced floating gate voltage, programs and verifies an adjacent memory cell to the reduced floating gate voltage, and verifies the first memory cell to an increased floating gate voltage that is greater than the reduced floating gate voltage.

5 Claims, 4 Drawing Sheets

REDUCTION OF ADJACENT FLOATING GATE DATA PATTERN SENSITIVITY

TECHNICAL FIELD OF THE INVENTION

The present invention relates generally to memory devices and in particular the present invention relates to programming of non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Two common types of flash memory array architectures are the "NOR" and "NAND" architectures. The architecture names refer to the resemblance that the memory cell configuration of each architecture has to a basic NOR or NAND gate circuit, respectively.

In the NOR array architecture, the floating gate memory cells of the memory array are arranged in a matrix. The gates of each floating gate memory cell of the array matrix are connected by rows to word select lines (wordlines) and their drains are connected to column bitlines. The source of each floating gate memory cell is typically connected to a common source line.

A NAND array architecture also arranges its array of floating gate memory cells in a matrix such that the gates of each floating gate memory cell of the array are connected by rows to wordlines. Each memory cell, however, is not directly connected to a source line and a column bit line. The memory cells of the array are instead arranged together in strings. Each string typically comprises 8, 16, 32, or more cells. The memory cells in the string are connected together in series, source to drain, between a common sourceline and a column bitline.

As the performance of electronic systems increase, the performance of flash memory devices in the systems should increase as well. A performance increase can include improving both the speed and the memory density of the devices. One way to accomplish both of these criteria is to reduce the memory device size.

One problem with decreasing the size of a NAND flash memory device is the floating gate-to-floating gate coupling that occurs as the memory cells get closer together. The overall height of the floating gates are not reduced much since that also reduces the coupling of the wordline and impacts the program and erase operations on the cells. The increased capacitive coupling between the floating gates creates a data pattern sensitivity such that data programmed on one cell can affect the verification and reading of an adjacent cell.

For the reasons stated above, and for other reasons stated below which will become apparent to those skilled in the art upon reading and understanding the present specification, there is a need in the art for a way to reduce the effect of capacitive coupling between adjacent floating gates.

SUMMARY

The above-mentioned problems with floating gate capacitive coupling and other problems are addressed by the present invention and will be understood by reading and studying the following specification.

The embodiments of the present invention encompass a method for programming an array of memory cells arranged in rows and columns. The method comprises erasing at least a first memory cell of the array of memory cells. The first memory cell is then programmed such that a coupling effect from adjacent memory cells is taken into account.

In one embodiment, the first memory cell is soft programmed to a reduced threshold voltage. The first memory cell can then be verified to an increased threshold voltage that is greater than the reduced voltage due to the capacitive coupling between adjacent floating gates. This method can be performed starting at the bottom of a bitline and continuing to the top nearest the drain select line. The last memory cell to be programmed can then be verified to the increased floating gate voltage.

Further embodiments of the invention include methods and apparatus of varying scope.

DETAILED DESCRIPTION

Figure 1:
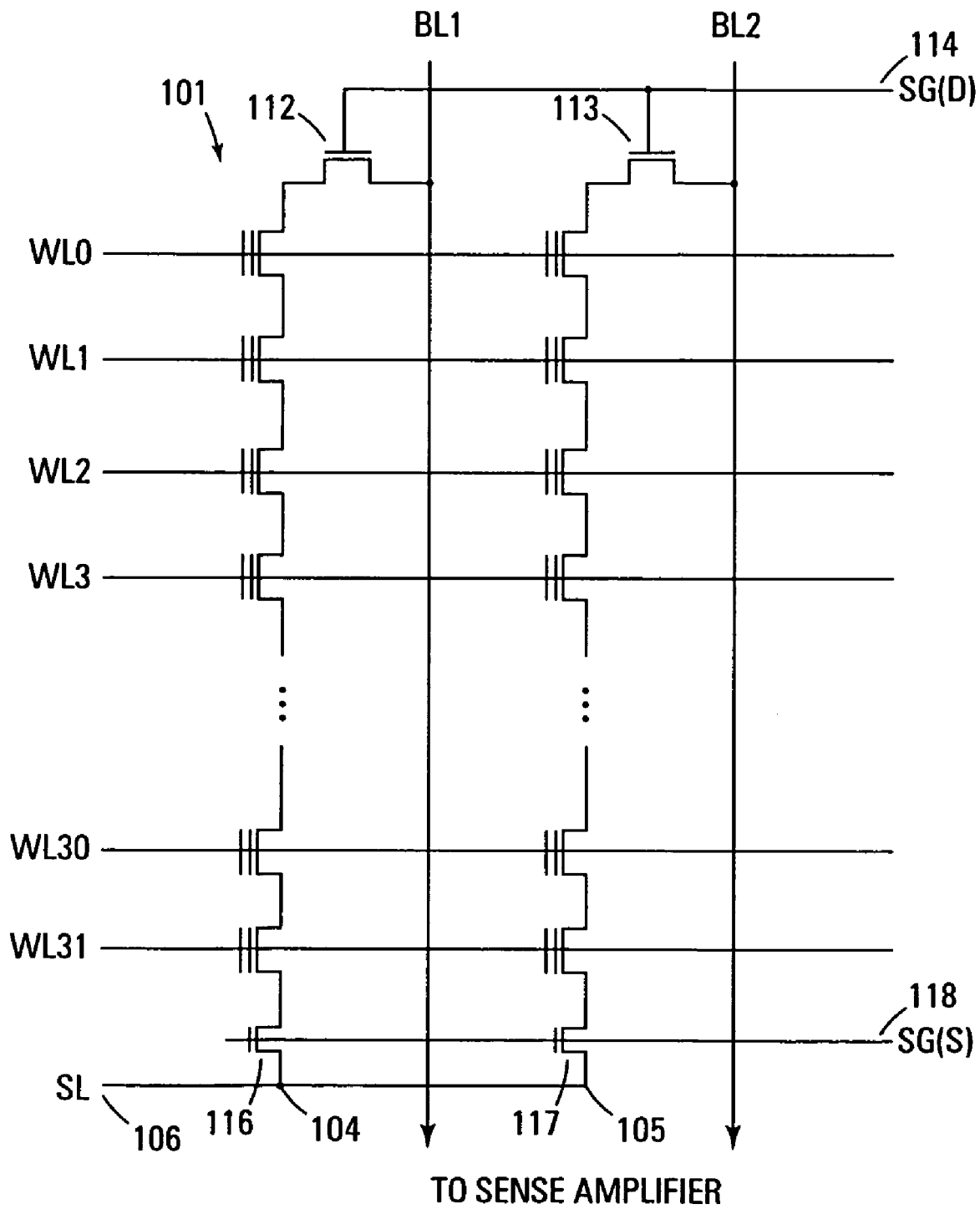
FIG. 1 shows a simplified diagram of one embodiment of a NAND flash memory array architecture of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

The voltages given in the following description of the embodiments of the present invention are for purposes of illustration only. The actual voltages will vary with the type of memory device and the technology used to manufacture the memory device. Therefore, the present invention is not limited to any one range of gate voltages, programming voltages, threshold voltages, or other voltages.

FIG. 1 illustrates a simplified diagram of one embodiment for a NAND flash memory array of the present invention. The memory array of FIG. 1, for purposes of clarity, does not show all of the elements typically required in a memory array. For example, only two bitlines are shown (BL1 and BL2) when the number of bitlines required actually depends upon the memory density. The bitlines are subsequently referred to as (BL1-BLN).

The array is comprised of an array of floating gate cells 101 arranged in series strings 104, 105. Each of the floating gate cells 101 are coupled drain to source in each series chain 104, 105. A word line (WL0-WL31) that spans across multiple series strings 104, 105 is coupled to the control gates of every floating gate cell in a row in order to control their operation. The bitlines (BL1-BLN) are eventually coupled to sense amplifiers (not shown) that detect the state of each cell.

In operation, the wordlines (WL0-WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bitline (BL1-BLN) by a drain select gate 112, 113. The source select gates 116, 117 are controlled by a source select gate control line SG(S) 118 coupled to their control gates. The drain select gates 112, 113 are controlled by a drain select gate control line SG(D) 114.

Each cell can be programmed as a single bit per cell (SBC) or multiple bits per cell (i.e., multilevel cell—MLC). Each cell's threshold voltage ($V_t$) determines the data that is stored in the cell. For example, in a single bit per cell, a $V_t$ of 0.5V might indicate a programmed cell while a $V_t$ of −0.5V might indicate an erased cell. These are indicative of floating gate voltages such that, assuming a wordline to floating gate coupling ratio of 50%, the wordline voltages would be 1.0V and −1.0V, respectively.

For single bit cells, the $V_t$ window is larger than the $V_t$ for a multilevel cell. The multilevel cell may have multiple $V_t$ windows that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

For example, a cell may be assigned four different voltage ranges of 200 mV for each range. The quantity of voltage ranges required depends on the quantity of bits stored in the cell. Also, a dead space or guard band of 0.2V to 0.4V may be located between each voltage range. If the voltage detected on the cell is within the first range, the cell is storing a 00. If the voltage is within the second range, the cell is storing a 01. This continues for as many ranges that are used for the cell. These voltage ranges are for purposes of illustration only as the present invention is not limited to a certain quantity of voltage ranges, a voltage range, bit assignments, or guard band spacing.

During a typical prior art programming operation, the selected wordline for the flash memory cell to be programmed is biased with a programming pulse at a voltage that is greater than 16V. A verification operation with a wordline voltage of 0V is then performed to determine if the floating gate is at the proper voltage (e.g., 0.5V). The unselected wordlines for the remaining cells are typically biased at approximately 10V during the program operation. Each of the memory cells is programmed in a substantially similar fashion.

The embodiments of the programming method of the present invention program each cell taking into account the effect that particular cell has on adjacent cells. This can be done with a soft programming pulse that performs a partial program of the cell to a threshold voltage that is less than the prior art voltage but that is then increased by the coupling effect of an adjacent cell being programmed.

The subsequently discussed voltages for soft programming and verifying the memory cells of the present invention are for purposes of illustration only. The present invention is not limited to any one $V_t$ since different types of flash memory may have different coupling ratios between floating gates. For example, a high coupling ratio between floating gates of adjacent cells would require that the verification operation be performed to a lower $V_t$.

Figure 2:
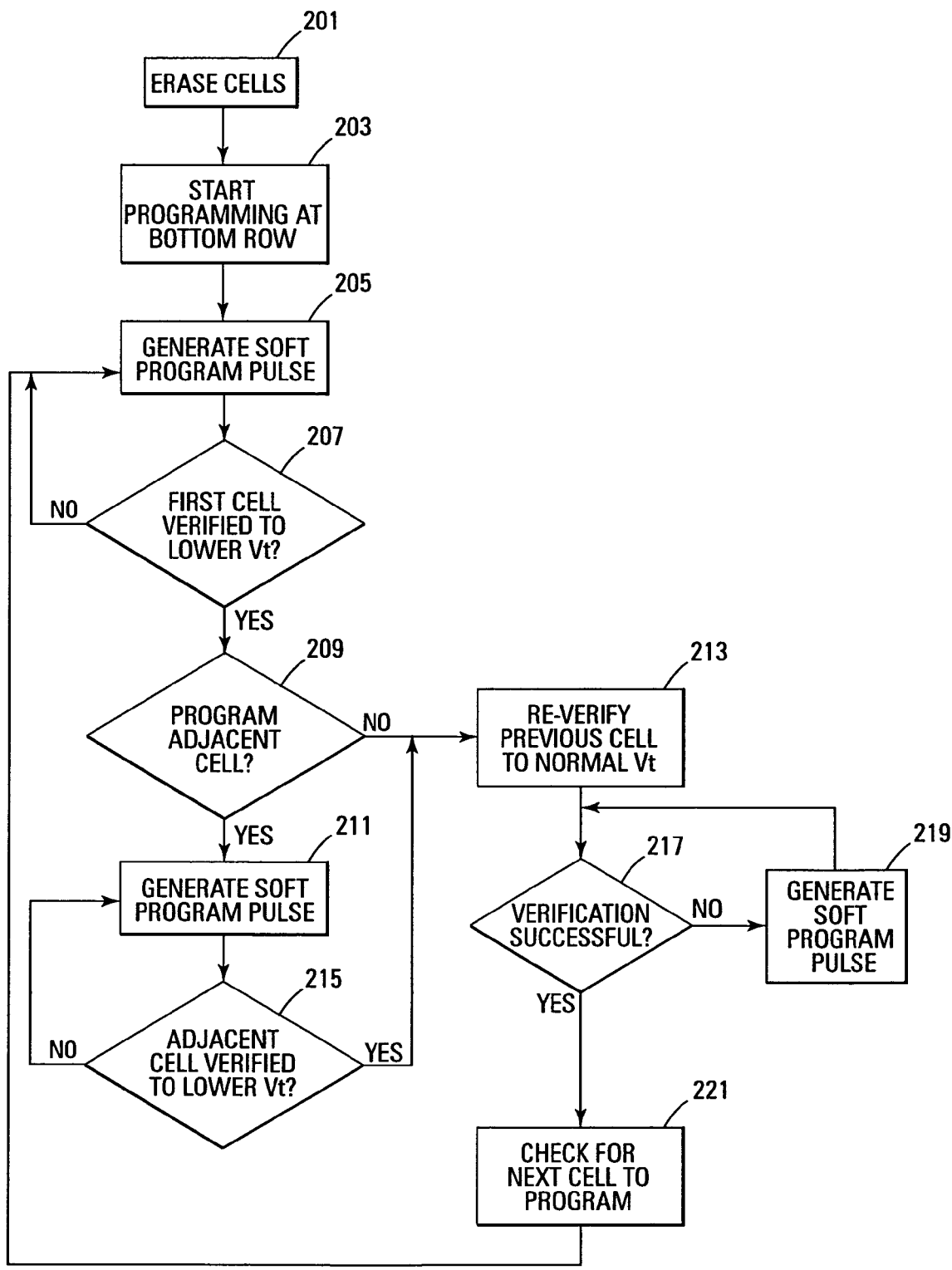
FIG. 2 shows a flowchart of one embodiment for a method for programming memory cells to reduce or eliminate floating gate-to-floating gate data pattern sensitivity in a memory device.

FIG. 2 illustrates a flowchart of one embodiment of a method of the present invention for programming a memory array in order to reduce or eliminate adjacent floating gate data pattern sensitivity caused by capacitive coupling of adjacent floating gates. The method begins with the cells to be programmed being in an erased state 201. This may require that at least a subset (e.g., a block) of the memory array be erased by an erase operation.

If a cell is to be programmed, the method starts at the bottom row of the array 203. This is the row closest to the SG(S) line 118 of FIG. 1. Alternate embodiments may start at the row at the top of the array closest to the SG(D) line 114.

A soft programming pulse is generated to bias the wordline of the cell 205 to be programmed in order to raise its control gate voltage from the −1V erased voltage to 0.8V. This voltage is 0.2V less than a typical control gate voltage for a programmed cell. The soft programming may be accomplished by a shorter than normal programming pulse and/or programming pulse having a lower voltage.

A verification operation is then performed on the programmed cell 207 to verify that it was programmed to the lower $V_t$ voltage. If the lower $V_t$ voltage has not been reached, the cell is programmed 205 until its control gate is raised to the lower $V_t$.

The verification operation of the present invention uses a higher voltage on the selected wordline than is normally used in a prior art verification. In one embodiment, the selected wordline is biased with 1.0V during verification and the unselected wordlines are biased at 4.5V. The higher verification voltage is used since it may not be desirable to use a verification voltage that is substantially similar to a read voltage. Alternate embodiments may use other voltage levels for both the selected and unselected wordlines.

Once the initial cell has been verified 207, it is determined whether the adjacent cell in the series string is to be programmed 209. If the adjacent cell is not to be programmed, the previously programmed cell should be re-verified 213 at a "normal" $V_t$ level. In one embodiment, this is a threshold voltage of 1.0V. Since this cell was programmed only to 0.8V or some other lower $V_t$, the cell is probably going to require an additional programming pulse or pulses to bring its voltage up to the normal $V_t$.

If the verification of the previously programmed cell was not successful 217, another programming pulse is generated 219 for the cell. The programming and verification steps 219 and 217 are repeated until the verification operation is successful at which point the next cell to be programmed is checked 221.

If the cell that is adjacent in the series string to the previously programmed cell is to be programmed 209, a soft programming pulse is generated 211 for this adjacent cell. A verification operation is performed on the adjacent cell 215. The programming/verification operations 211 and 215 are repeated until the adjacent cell is programmed and successfully verified to the lower $V_t$.

The method then returns to the previously programmed cell (i.e., the lower wordline) and performs another verification operation 213. This verification is performed to the "normal" $V_t$ 213 since the coupling between the floating gate on the adjacent programmed cell pulls up the floating gate on the previously programmed cell.

The above-described method is repeated for each cell in the series string of memory cells from WL31 up to WL0 of FIG. 1. On WL0, since there is no impact from a floating gate of a cell above it, this cell is verified to the normal $V_t$.

In an alternate embodiment, additional floating gate-to-floating gate coupling can be removed by verifying from −1.0 to 0.78V. This may be necessary since, when the lower wordline cell is verified, the upper wordline cell has moved from −1.0 to 0.8V and may move another 200 mV later. This may be corrected by a method that is substantially similar to the embodiment illustrated in FIG. 2 except that each row, except the last row to be programmed, is verified to 0.78V. Additionally, this embodiment re-verifies the lower two adjacent rows instead of the lower single adjacent row.

In another alternate embodiment, the adjacent cells may be considered to be the cells in the adjacent bitline instead of the adjacent cells in the same bitline. In such an embodiment, the method of FIG. 2 would be used except cells on alternate bitlines would be programmed/verified. In other words, bit 0 on BL1 would be programmed/verified to the lower $V_t$, then bit 0 on BL2 would be programmed/verified. The method then would reverify bit 0 on BL1. This alternating would continue up each bitline.

Figure 3:
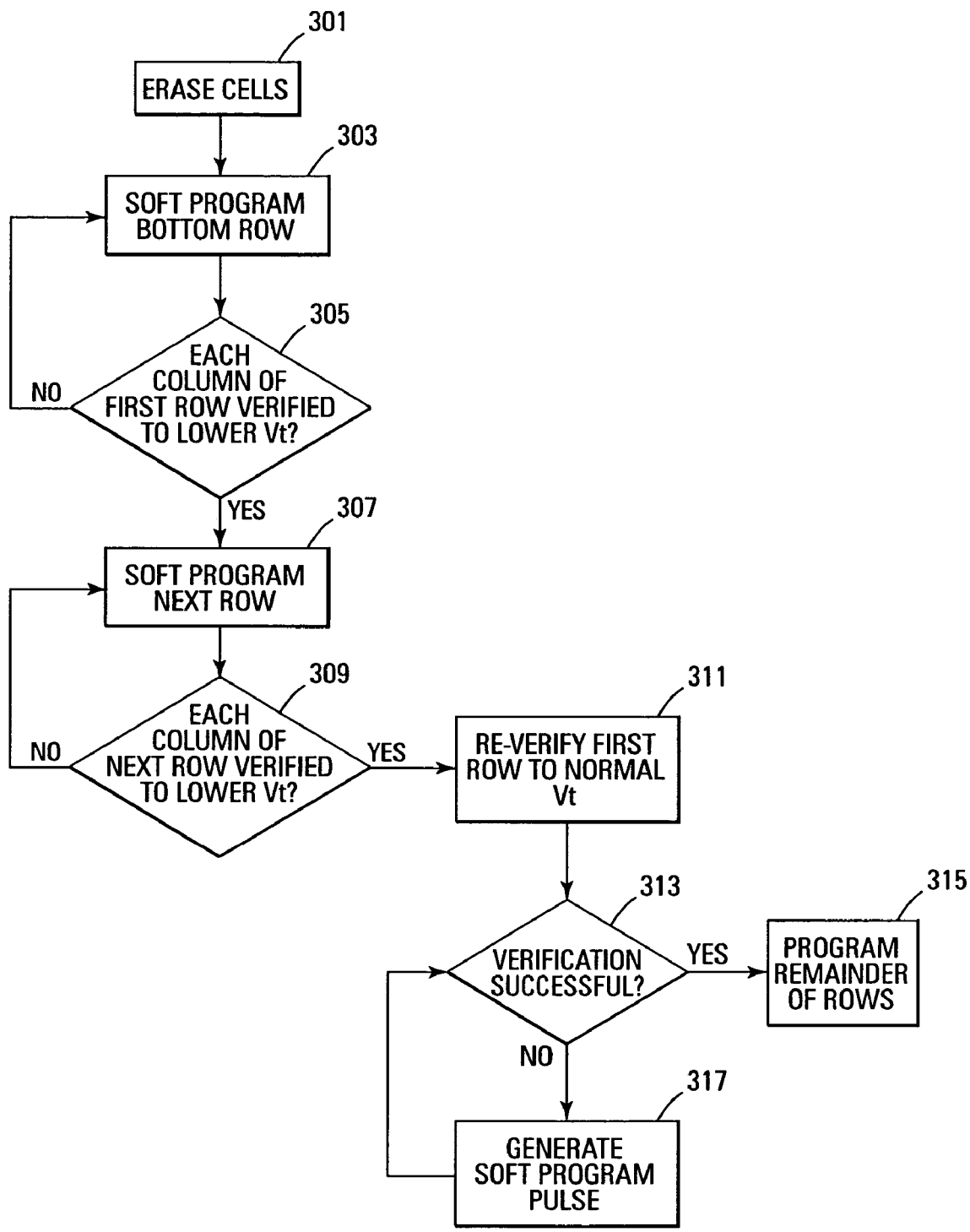
FIG. 3 shows a flowchart of an alternate embodiment for a method for programming memory cells to reduce or eliminate floating gate-to-floating gate data pattern sensitivity in a memory device.

FIG. 3 illustrates a flowchart of an alternate embodiment for a method for programming memory cells to reduce or eliminate floating gate-to-floating gate data pattern sensitivity in a memory device. The method begins with the cells to be programmed being in an erased state 301. This may require that at least a subset (e.g., a block) of the memory array be erased by an erase operation.

The bottom row of cells (e.g., row 0) is then programmed 303, with a soft program pulse, to a lower than normal $V_t$ (e.g., 0.2V less than normal $V_t$). The row is then verified to the lower $V_t$ 305. If the reduced $V_t$ has not been reached, the soft programming continues until each column in the row is verified.

The next row up (e.g., row 1) from the bottom is then programmed in the same manner 307. This row is then verified to the lower $V_t$ 309. The programming of this row is performed until the lower threshold voltage is achieved.

Each column of the first row that was programmed is then re-verified 311 to a normal threshold voltage for that memory technology (e.g., 1.0V). If the verification of the first row is successfully verified 313, the remainder of the rows of the block are programmed in the same alternating fashion 315. If the verification fails 313, a soft programming pulse is generated 317 until the higher $V_t$ for the row is reached.

The above-described embodiments of the present invention allow the use of larger variances in the level of programming pulses applied and, hence, speed up the programming operation. Since NAND flash memory devices are programmed with pulses that each increase in predetermined voltage steps from a lower voltage (e.g., 14V) to a higher voltage (e.g., 20V), to get within 100 mV of $V_t$ distribution, variation from voltage-to-voltage on a wordline would need to be 100 mV. This results in a relatively large number of steps from the lower voltage to the higher voltage, thus impacting the programming time.

By reducing the coupling effect of adjacent cells with the embodiments of the present invention, the $V_t$ guard band between states does not have to be as large and a larger $V_t$ distribution window can be used with resulting larger step voltages. For example, elimination of the coupling effect might enable a 400 mV window to be used with 200 mV increments, thus decreasing the programming time.

Figure 4:
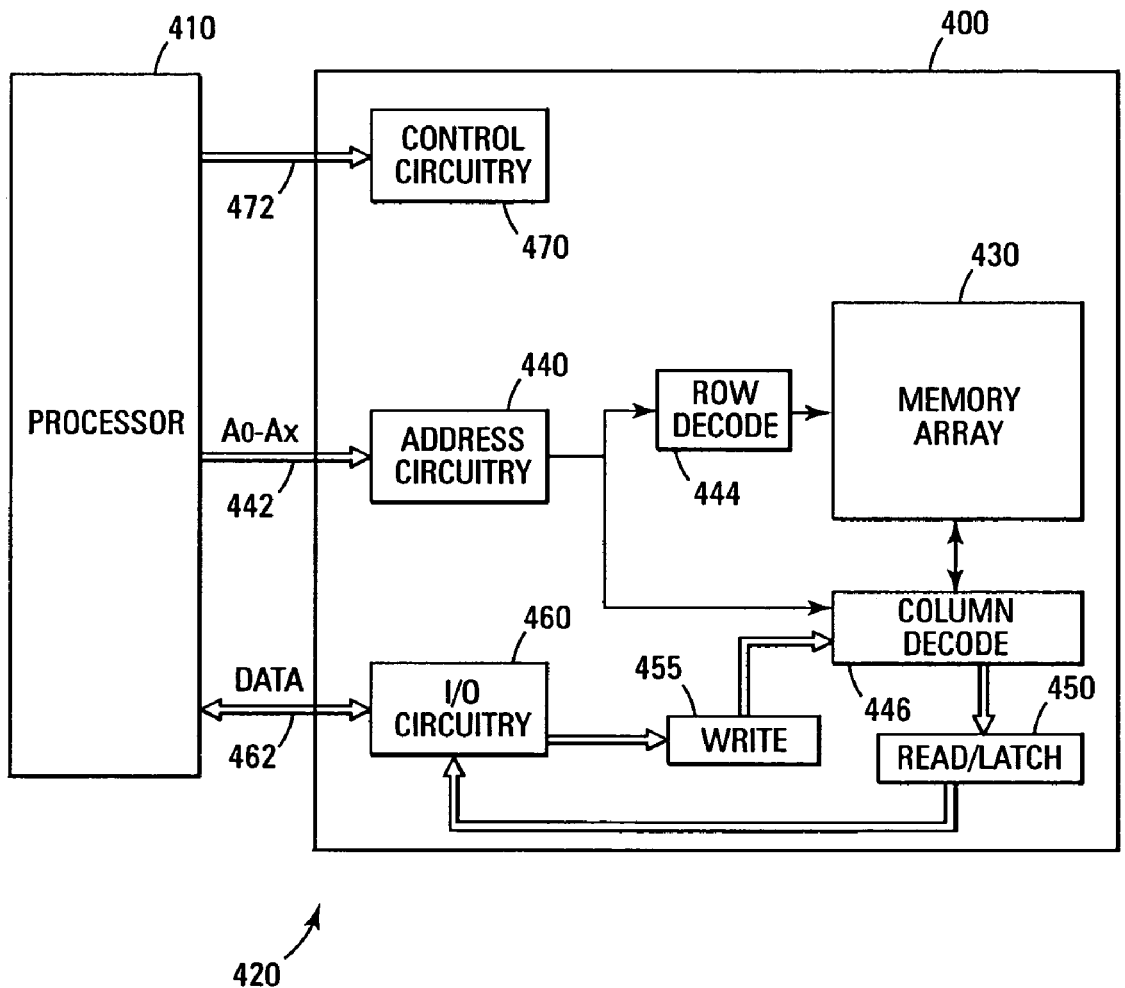
FIG. 4 shows a block diagram for one embodiment of an electronic system of the present invention.

FIG. 4 illustrates a functional block diagram of a memory device 400 that can incorporate the flash memory cells of the present invention. The memory device 400 is coupled to a processor 410. The processor 410 may be a microprocessor or some other type of controlling circuitry. The memory device 400 and the processor 410 form part of an electronic system 420. The memory device 400 has been simplified to focus on features of the memory that are helpful in understanding the present invention.

The memory device includes an array of flash memory cells 430. The memory array 430 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture. The memory cells of the present invention can be arranged in either a NAND or NOR architecture as well as other architectures.

An address buffer circuit 440 is provided to latch address signals provided on address input connections A0-Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense amplifier/buffer circuitry 450. The sense amplifier/buffer circuitry, in one embodiment, is coupled to read and latch a row of data from the memory array 430. Data input and output buffer circuitry 460 is included for bi-directional data communication over a plurality of data connections 462 with the controller 410. Write circuitry 455 is provided to write data to the memory array.

Control circuitry 470 decodes signals provided on control connections 472 from the processor 410. These signals are used to control the operations on the memory array 430, including data read, data write, and erase operations. The control circuitry 470 may be a state machine, a sequencer, or some other type of controller. In one embodiment, the control circuitry 470 is a state machine that performs the embodiments of the method for programming a memory array in order to reduce or eliminate adjacent floating gate data pattern sensitivity.

The flash memory device illustrated in FIG. 4 has been simplified to facilitate a basic understanding of the features of the memory and is for purposes of illustration only. A more detailed understanding of internal circuitry and functions of flash memories are known to those skilled in the art. Alternate embodiments may include the flash memory cell of the present invention in other types of electronic systems.

CONCLUSION

In summary, embodiments of the method of the present invention provide for programming memory cells of a memory array such that floating gate-to-adjacent floating gate data pattern sensitivity is reduced or eliminated. This is accomplished by performing soft programming operations on the memory cells while taking into account the coupling effect on adjacent cells.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming an array of memory cells arranged in rows coupled to word lines and columns coupled to bit lines, the method comprising:

programming a first word line of memory cells to a first threshold voltage;

programming a second word line of memory cells, adjacent to the first word line, to the first threshold voltage;

programming a third word line of memory cells, adjacent to the second word line, to the first threshold voltage; and verifying the first word line of memory cells and the second word line of memory cells to a second threshold voltage that is higher than the first threshold voltage after programming the third word line of memory cells.

2. The method of claim 1 wherein the array of memory cells is arranged in a NAND architecture.

3. The method of claim 1 wherein programming the first, second and third word lines comprises biasing a control gate of each memory cell to be programmed with at least one programming pulse such that a positive programmed voltage is produced on a floating gate of each memory cell to be programmed.

4. The method of claim 1 and further including biasing unselected word lines with 4.5V.

5. The method of claim 1 wherein verifying the first word line of memory cells to the second threshold voltage comprises biasing the first word line with a voltage that is greater than or equal to 1.0V and biasing unselected word lines at 4.5V.

* * * * *